United States Patent [19]

Welles, II et al.

[11] Patent Number: 4,729,110

[45] Date of Patent: Mar. 1, 1988

[54] CORRECTION OF OFFSET AND GAIN ERRORS IN RF RECEIVERS

[75] Inventors: Kenneth B. Welles, II, Schenectady; Sharbel E. Noujaim, Clifton Park, both of N.Y.

[73] Assignee: General Electric Company, Schenectady, N.Y.

[21] Appl. No.: 685,351

[22] Filed: Dec. 24, 1984

[51] Int. Cl.[4] .................. G06J 1/00; G06F 15/20
[52] U.S. Cl. ............................ 364/571; 364/573
[58] Field of Search ............ 364/571, 573, 574, 579, 364/550, 551

[56] References Cited

U.S. PATENT DOCUMENTS

| | | | |
|---|---|---|---|
| 4,193,039 | 3/1980 | Massa et al. | 364/571 X |
| 4,326,168 | 4/1982 | Acker | 328/162 |
| 4,414,638 | 11/1983 | Talambiras | 364/573 X |
| 4,573,133 | 2/1986 | White | 364/571 |
| 4,587,622 | 5/1986 | Herzog | 364/571 X |
| 4,616,329 | 10/1986 | Abrams et al. | 364/571 |

Primary Examiner—Gary V. Harkcom
Assistant Examiner—H. R. Herndon
Attorney, Agent, or Firm—Lawrence D. Cutter; James C. Davis, Jr.; Marvin Snyder

[57] ABSTRACT

Sampled and digitized in-phase and quadrature phase signals are algebraically accumulated in offset accumulators, the contents of which are periodically employed to adjust the value of offset correction factors added to each signal path. Additionally, the absolute values of the in-phase and quadrature phase signals are accumulated in gain accumulators, the contents of which are periodically employed to adjust the gain factor multiplier in one of the signal paths.

13 Claims, 1 Drawing Figure

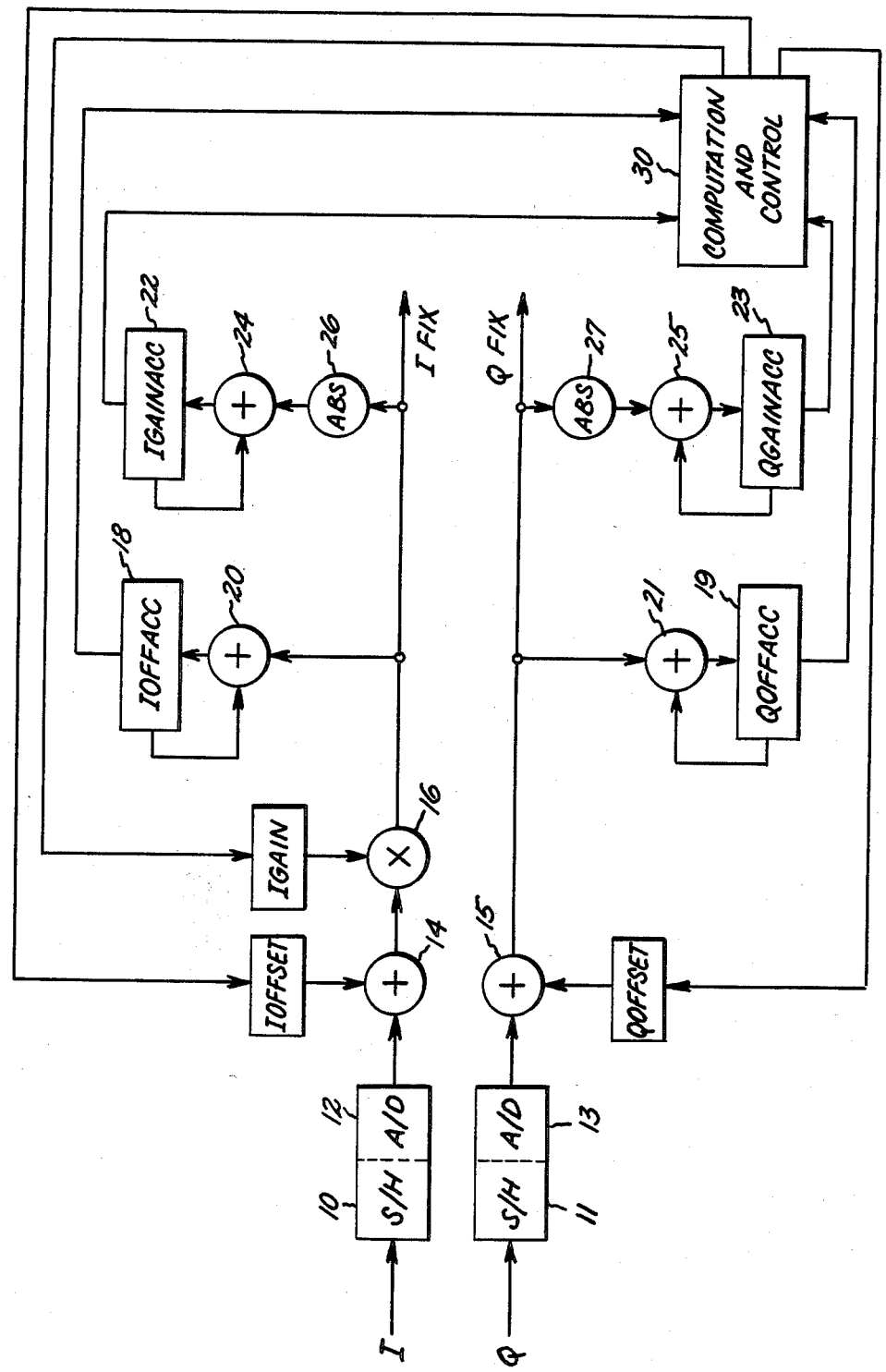

CORRECTION OF OFFSET AND GAIN ERRORS IN RF RECEIVERS

BACKGROUND OF THE INVENTION

The present invention relates a method and an apparatus for correcting offset and gain errors occurring in FM broadcast receivers. More particularly, the present invention relates to a system of adders and accumulators which are configured to correct for offset and gain errors.

The zero IF receiver concept for FM reception relies on linear measurements of the in-phase signal, I, and the quadrature phase signal, Q. To compensate for different station signal strengths, the I and Q analog signals are amplified by an amount varying inversely with the strength of the desired signal. Analog programmable gain circuits, however, are susceptibel to errors in offset and relative gain. Offset and gain errors show up in the received signal as a reduced signal-to-noise ratio. To generate the best reception possible, it is therefore desirable to reduce offset errors in the in-phase and quadrature phase singals to zero, or to a vlue smaller than the quantification level of the system. Additionally, to produce the best reception, it is desirable to cause the in-phase and quadrature phase signals to be amplified by the same amounts. Prior efforts at achieving these objectives have concentrated on designing analog sections for the in-phase and quadrature phase gain stages from high quality, low tolerance analog components which have small offset and matched gain.

However, if one wishes to construct such receiver circuitry on an integrated circuit chip, the high quality design of the analog circuitry for the in-phase and quadrature phase signal paths becomes a problem. In such integrated circuit analog designs, the circuit paths typically do not exhibit zero offset or matched gain. Accordingly, it is an object of the present invention to provide a digital correction mechanism for on-chip analog circuits so as to improve the signal quality with inexpensive analog and digital circuitry implemented on a single circuit chip.

SUMMARY OF THE INVENTION

In accordance with a preferred embodiment of the present invention, a method for correcting offset errors in a sampled and digitized signal includes adding a signed offset correction term to each of the digitized samples and at the same time accumulating the algebraic sum of a number of these digitized samples in an accumulator during which time the offset correction term is kept constant. Periodically, based upon the contents of the accumulator, an updated offset correction term is determined and is used to replace the previous offset correction term after which the accumulator is reset to zero. An apparatus for carrying out this method is also described herein.

In accordance with another embodiment of the present invention, a method for operating a digital circuit to correct for gain drift differences between sampled and digitized in-phase and quadrature phase channels includes employing a digital multiplier in one of the channels. The sum of the absolute values of the in-phase and quadrature phase signals are accumulated in in-phase and quadrature phase gain accumulators, respectively, over a number of samples. Periodically, based upon the contents of the gain accumulators, an updated gain correction factor is generated and used to replace the factor used in the digital multiplier. A digital apparatus for carrying out this method is also described herein. More particularly in a preferred embodiment of the present invention, a digital circuit is disclosed for simultaneously correcting offset and gain errors in in-phase and quadrature phase signal paths.

Accordingly, it is an object of the present invention to provide a method and apparatus for correcting offset errors in an analog signal which has been digitized.

It is also an object of the present invention to provide a method and apparatus for correcting gain errors in sampled and digitized in-phase and quadrature phase signal paths.

It is yet another object of the present invention to provide digital circuitry for use on an integrated circuit chip along with analog circuitry.

It is also an object of the present invention to provide RF receiver systems for use in integrated circuit chips.

Lastly, but not limited hereto, it is an object of the presetn invention to provide improved signal-to-noise response in RF receivers.

DESCRIPTON OF THE FIGURE

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawing in which:

The FIGURE illustrates, in a schematic fashion, the signal flow diagram of a preferred embodiment of the present invention.

DETAILED DESCRIPTION OF THE INVENTION

The FIGURE illustrates the signal flow in the method and apparatus of the present invention. In particular, analog in-phase and quadrature signals, I and Q, respectively, are supplied to sample-and-hold circuits 10 and 11, which in turn supply analog-to-digital conversion circuits 12 and 13, thereby generating sampled and digitized versions of the I and Q signals. Apart from digital multiplier circuit 16 shown in the in-phase signal path, signal processing for both signal paths is substantially identical. Accordingly, for ease of discussion and understanding, the present discussion is particularly directed to signal processing which occurs in the in-phase or I signal path.

More particularly, the digitized in-phase signal from A/D converter 12 is supplied to digital adder 14 to which an offset correction term IOFFSET is also added. This offset correction value is periodically updated by computation and control circuitry 30 in response to the contents of accumulator 18, which is now described. After the in-phase signal is multiplied by a gain correction factor, IGAIN, digitized output signal IFIX results. Each of the output samples of the IFIX signal is added to accumulator 18, labeled IOFFACC in the FIGURE. The schematic flow diagram illustrates that the present value of the digitized in-phase output is added to the value previously contained in the IOFFACC accumulator by means of adder 20. The contents of this accumulator are periodically examnined by computation and control circuitry 30 to determine an updated value for IOFFSET. Periodically, for example, after every 8,192 samples, the accumulator IOFFACC is reset to zero. The natur of the addition operation into IOFFACC is algebraic. As intended here and in the appended claims, the term "algebraic" is meant to indicate that the addition performed is a signed number addition oepation, such as that which may, for example, be carrie dout in a two's complement notational system. After a large number, N, of samples are accumulated in IOFFACC, IOFFSET is adjusted. There are two principle methods disclosed herein for accomplishing this adjustment.

In the first method, if the contents of IOFFACC are significantly different from zero, then the contents of accumulator 18 divided by N, the number of samples, is subtracted from IOFFSET by the computation and control circuitry 30, and this updated value for IOFFSET is employed for the next period of time over which N samples are again added to the in-phase offset accumulator 18 or IOFFACC, which is cleared each cycle. Additionally, in a somewhat simpler method, it is also possible to decrease IOFFSET by a small amount independent of the specific contents of IOFFACC as long as the contents of accumulator IOFFACC are greater than zero by a specified amount. If the contents of IOFFACC are less than zero by a specific amount, the value of IOFFSET is increased by a small fixed amount. this small change in the offset value may take the form of incrementing or decrementing a counter which represents IOFFSET. The first more complex method provides a proper offset correction in one cycle of N samples. The second, simpler method contains proper offset correction only after several cycles of N sample. However, this is acceptable in a final system because even this larger number of samples typically represents less than one second of listening time.

As noted above, the offset correction for the quadrature phase signal path is effected in the same manner. In particular, quadrature phase offset accumulator 19, QOFFACC, is employed in a manner analogous to the use of accumulator IOFFACC. Again, as above, computation and control circuitry 30 is employed in the same manner as previously described to effectuate modification of the value QOFFSET which is added to each of the sampled and digitized quadrature phase signal samples. The more complicated method of updating the offset values as described above, is sumamrized in the following two formulas:

$$IOFFSET = IOFFSET - IOFFACC/N, \text{ and}$$

$$QOFFSET = QOFFSET - QOFFACC/N.$$

Attention is now specifically directed to the gain correction apparatus and circuitry. In particular, it is noted that while a gain multiplier is employed in the in-phase signal path in the FIGURE herein, it is also equally applicable to employ this multiplier in the quadrature phase signal path. The only variation to be made if this change in multiplier location is adopted, is in the specific method employed in updating the gain multiplying factor, IGAIN. The specific method and apparatus for updating the gain factor, IGAI, is now discussed. Again, the discussion is directed to processing which occurs in the in-phase signal path only for convenience of discussion. An analagous process may be employed in the quadrature phase signal path. In particular, sampled and digitized output signals from multiplier 16 in the in-phase path are accumulated in accumulator 22, IGAINACC, the gain accumulator for the in-phase signal path. The addition operation here, in adder 24, proceeds in the same way as for IOFFACC except for the fact that the absolute value of the signal sample is generated prior to its being added to the gain accumulator 22. The same sort of operation is performed in the quadrature phase signal path to generate a corresponding absolute value for storage in accumulator 23, QGAINACC. Adder 25 functions in a manner analogous to the operation of adder 24. As above, the contents of IGAINACC and QGAINACC are periodically examined by computation and control circuitry 30 to determine an updated value for IGAIN. In accordance with one embodiment of the present invention, if the ratio of the contents of the in-phase gain accumulator 22 to the contents of the quadrature phase gain accumulator 23 differes significantly from 1.0, then the following adjsutment is made to IGAIN:

$$IGAIN = IGAIN*[QGAINACC]/[IGAINACC],$$

where the brackets denot "the contents of". Alternatively, it is possible to multiply IGAIN by a small fixed amount greater than 1.0 if the contents of QGAINACC are greater than the contents of IGAINACC. Likewise, the value IGAIN may be multiplied by a small fixed amount les sthan 1.0 if QGAINACC is less than IGAINACC. As above, this second simpler method attains proper gain correction after several cycles, each with N samples. Again, for the reasons stated above, this is nonetheless an acceptable condition.

Additionally, it is noted that in the above operations relating to the four accumulators shown in the FIGURE, accumulators 18, 19, 22 and 23 are reset to zero after the offset terms and gain factor have been updated. Since the sample rate of the in-phase and quadrature phase signals is unrelated to the incoming FM signal, and therefore to the I and Q signals themselves, the average I and Q value is zero, and the I and Q samples amplitudes should be equal. It can be seen that if the quadrature detector filter and gain stages modify the I and Q sections by introducing offset and gain errors, then the digital correction system described adapts to these errors and removes them from the output signals, IFIX and QFIX.

It is also noted in the system described above that for conventional FM broadcast signals, a digital circuit sampling rate of 228 kHz is preferable. Additionally, while the discussion above has been silent with respect to the number of binary digits employed in the digitized sample representation, a preferable number of digits to employ in an application related to FM broadcast reception is typically about 8 bits. However, the method and apparatus of the present invention are not limited by the above-described sampling rate or by the number of bits employed in the various adders and accumulators. Of course, it is highly desirable to employ a sufficient number of bits in each accumulator to accommodate the number representation employed.

Accordingly, it is seen then that the method and apparatus disclosed herein is readily capable of correcting for the offset and gain errors generated by the analog portion of the circuitry. It is further seen that the apparatus and method of the present invention are readily implementable on a single integrated circuit chip so as to produce improved reception and signal-to-noise ratios. While the invention herein has been described in terms of in-phase and quadrature phase signal channels, it should be realized that it is applicable to any pair of signal channels having essentially the same relative signal characteristics, such as relative strength and zero means.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for operating a digital circuit to correct for offset errors in a sampled and digitized signal, said method comprising the steps of:
   adding a signed offset correction term to each of said digitized samples;
   accumulating the algebraic sum of a number N of said digitized samples ina n accumulator, during which time said offset correction term is kept constant;
   determining, based on the contents of said accumulator, an updated offset correction term equal to said offset correction term minus, the contents of said accumulator divided by N;
   updating said offset correction term in correspondence with said determination based on the contents of said accumulator;
   resetting said accumulator to zero; and
   periodically repeating the previous steps.

2. The method of claim 1 in which said offset correction term is updated by adding to its current value a fixed signed amount upon the condition that the contents of said accumulator differ from zero by a predetermined value, otherwise said offset correction term being unchanged.

3. The method of claim 1 in which N is a power of 2.

4. A method of operating a digital circuit to correct for gain drift differences between sampled and digitized in-phase and quadrature phase signal channels, said method comprising the steps of:
   digitally multiplying said in-phase signal by a gain correction factor for each signal sample;
   accumulating the sum of the absolute values of said in-phase and said quadrature phase signals in an in-phase gain accumulator and a quadrature phase gain accumulator respectively, said accumulation occurring for a number of samples N during which time said gain correction factor is kept constant;
   determining, based on the contents of said in-phase gain accumulator and said quadrature phase gain accumulator, an updated correction factor equal to the gain correction factor times the ratio of the contents of said quadrature phase gain accumulator to the contents of said in-phase gain accumulator;
   updating said offset correction factor in correspondence with said determination based on said accumulator contents;
   resetting said accumulators to zero; and
   periodically repeating the previous steps.

5. The method of claim 4 in which said updated correction factor is equal to the gain correction factor times a fixed signed amount, upon the condition that the ratio of the contents of said quadrature gain accumulator to the content of said in-phase gain accumulator exceeds a predetermined value, otherwise said gain correction factor being unchanged.

6. The method of claim 4 in which N is a power of 2.

7. A method for operating a digital circuit to correct for gain drift differences between sampled and digitized in-phase and quadrature phase signal channels, said method comprising the steps of:
   digitally multiplying said quadrature phase signal by a gain correction factor for each signal sample;
   accumulating the sum of the absolute values of said in-phase and said quadrature phase signals in an in-phase gain accumulator and a quadrature phase gain accumulator respectively, said accumulation occurring for a number of samples N during which time said gain correction factor is kept constant;
   determining, based on the contents of said in-phase gain accumulator and said quadrature phase gain accumulator, an updated correction factor equal to the gain correction factor times the ratio of the contents of said in-phase gain accumulator to the contents of said quadrature phase gain accumulator;
   updating said offset correction factor in correspondence with said determination based on said accumulator contents;
   resetting said accumulators to zero; and
   periodically repeating the previous steps.

8. The method of claim 7 in which said updated gain correction factor is equal to the gain correction factor times a fixed amount, upon the condition that the ratio of the contents of said in-phase gain accumulator to the contents of said quadrature phase accumulator exceeds a predetermined value, otherwise said gate correction factor being unchanged.

9. The method of claim 7 in which N is a power of 2.

10. A digital circuit for correcting offset and gain errors in sampled and digitized in-phase and quadrature phase signals, said circuit comprising:
    an in-phase offset accumulator;
    a first digital adder for albebraically adding an in-phase offset correction term to each of said in-phase signal samples;
    a second digital adder for algebraically adding said in-phase signal samples to said in-phase offset accumulator;
    a quadrature phase offset accumulator;
    a third digital adder for algebraically adding a quadrature phase offset correction term to each of said quadrature signal samples;
    a fourth digital adder for algebraically adding said quadrature phase sample to said quadrature phase offset accumulator;
    an in-phase gain accumulator;
    a fifth digital adder for adding the absolute value of said in-phase signal samples to said in-phase gain accumulator;
    a quadrature phase gain accumulator;
    a sixth digital adder for adding the absolute value of said quadrature phase signal samples to said quadrature phase gain accumulator;
    a digital multiplier for receiving sampled digital signals from either said first adder or from said third adder and for multiplying said signal by a gain correction factor;
    computation and control means for periodically updating said gain correction factor in response to the contents of said in-phase and quadrature phase accumulators to provide balanced gain between said in-phase and sai dquadrature phase signals, and for periodically resetting said gain accumulators to zero, and for periodically updating said in-phase and said quadrature offset correction terms in response to the contents of said in-phase and said quadrature phase offset accumulators, respectively and independently, and for periodically resetting said offset accumulators to zero.

11. A digital circuit for correcting offset errors in a sampled and digitized signal, said circuit comprising:
an offset accumulator;
a first digital adder for albegraically adding an offset correction term to said signal samples to produce an output signal;
a second digital adder for algebraically adding said output signal samples to said offset accumulator; and
computation and control means for periodically updating said offset correction term in response to the contents of said offset accumulator and for periodically resetting said offset accumulator to zero.

12. The digital circuit of claim 11 in which said offset correction term is updated by algebraically subtracting from said offset correction term, the contents of said offset accumulator divided by the number of said digitized samples contributing to the contents of said offset accumulator.

13. The digital circuit of claim 11 in which said offset correction term is updated by algebraically adding to said term a fixed constant, only upon the condition that the contents of said offset accumulator differ from zero by a predetermined value.

* * * * *